US011901257B2

United States Patent
Stoek et al.

(10) Patent No.: US 11,901,257 B2
(45) Date of Patent: Feb. 13, 2024

(54) SEMICONDUCTOR PACKAGE, METAL SHEET FOR USE IN A SEMICONDUCTOR PACKAGE, AND METHOD FOR PRODUCING A SEMICONDUCTOR PACKAGE (71) Applicant: Infineon Technologies AG, Neubiberg (DE)

(72) Inventors: Thomas Stoek, Buxtehude (DE); Michael Stadler, Munich (DE)

(73) Assignee: Infineon Technologies AG, Neubiberg (DE)

( * ) Notice: Subject to any disclaimer, the term of this patent is extended or adjusted under 35 U.S.C. 154(b) by 500 days.

(21) Appl. No.: 16/701,251

(22) Filed: Dec. 3, 2019

(65) Prior Publication Data
US 2020/0185301 A1    Jun. 11, 2020

(30) Foreign Application Priority Data

Dec. 5, 2018 (DE) .......................... 102018130936.8

(51) Int. Cl.
| H01L 23/367 | (2006.01) |
| H01L 23/495 | (2006.01) |
| H01L 21/56 | (2006.01) |
| H01L 23/373 | (2006.01) |
| H01L 23/31 | (2006.01) |
| H01L 21/48 | (2006.01) |
| H01L 23/498 | (2006.01) |

(52) U.S. Cl.
CPC ...... H01L 23/3675 (2013.01); H01L 21/4882 (2013.01); H01L 21/565 (2013.01); H01L 23/3107 (2013.01); H01L 23/3736 (2013.01); H01L 23/49568 (2013.01); H01L 23/49861 (2013.01)

(58) Field of Classification Search
CPC ............. H01L 23/367; H01L 23/49568; H01L 23/49861; H01L 23/3675; H01L 2023/4068
See application file for complete search history.

(56) References Cited

U.S. PATENT DOCUMENTS 6,831,372 B2 * 12/2004 Ruhland ................. H01L 24/83
257/E23.056
8,319,319 B2 * 11/2012 Jang .................. H01L 23/49503
257/676

(Continued)

FOREIGN PATENT DOCUMENTS

DE    102009002065 A1    10/2009
DE    102011007395 A1    10/2012

Primary Examiner — Dale E Page
Assistant Examiner — Abbigale A Boyle
(74) Attorney, Agent, or Firm — Murphy, Bilak & Homiller, PLLC (57) ABSTRACT A semiconductor package includes a semiconductor chip, an encapsulation body encapsulating the semiconductor chip, and a metal sheet having a first sheet surface and an opposite second sheet surface. The first sheet surface is exposed at the encapsulation body. The semiconductor chip is arranged at the second sheet surface. The first sheet surface has a pattern having first subdivisions having a first average roughness and second subdivisions having a second average roughness. The first average roughness is greater than the second average roughness.

23 Claims, 7 Drawing Sheets (56) References Cited

U.S. PATENT DOCUMENTS

| | | | | |
|---|---|---|---|---|
| 9,362,242 B2* | 6/2016 | Iwata | ............... | H01L 24/05 |
| 9,793,194 B2* | 10/2017 | Hayashi | ............... | H01L 21/4828 |
| 10,297,527 B2* | 5/2019 | Saito | ............... | H01L 21/4882 |
| 10,872,841 B2* | 12/2020 | Naba | ............... | H01L 24/32 |
| 2010/0068552 A1* | 3/2010 | Goerlich | ............... | H01L 24/32 |
| | | | | 428/615 |
| 2020/0266141 A1* | 8/2020 | Stadler | ............... | H01L 24/05 |

* cited by examiner

SEMICONDUCTOR PACKAGE, METAL SHEET FOR USE IN A SEMICONDUCTOR PACKAGE, AND METHOD FOR PRODUCING A SEMICONDUCTOR PACKAGE

TECHNICAL FIELD

The present disclosure relates to a semiconductor package, a metal sheet for use in a semiconductor package, and a method for producing a semiconductor package.

BACKGROUND

During operation, semiconductor packages can have a considerable heat output, which must be dissipated by fitting heat sinks. In this case, it is crucial to minimize the thermal resistance between the source of the evolution of heat (e.g. a semiconductor chip) and the heat sink, in order to ensure as efficient heat dissipation as possible. At the same time, semiconductor packages can have electrolytically applied layers, which can serve e.g. for soldering the semiconductor package to a circuit board. During the soldering process, for example, unevennesses can arise in such electrolytic layers and they enlarge the heat conducting path between semiconductor chip and heat sink and thus increase the thermal resistance. Such unevennesses can be minimized by the use of improved semiconductor packages, improved metal sheets and improved methods for producing semiconductor packages.

The stated problem addressed by the invention is solved by means of the features of the independent patent claims. Advantageous configurations and developments of the invention are specified in the dependent claims.

SUMMARY

Individual examples relate to a semiconductor package, comprising a semiconductor chip, an encapsulation body, which encapsulates the semiconductor chip, and a metal sheet having a first sheet surface and an opposite second sheet surface, wherein the first sheet surface is exposed at the encapsulation body and wherein the semiconductor chip is arranged at the second sheet surface, and wherein the first sheet surface has a pattern having first subdivisions having a first average roughness and second subdivisions having a second average roughness, wherein the first average roughness is greater than the second average roughness.

Individual examples relate to a metal sheet for use in a semiconductor package, the metal sheet comprising a first sheet surface and an opposite second sheet surface, wherein the second sheet surface is configured for application to a semiconductor chip and, wherein the first sheet surface has a pattern of first subdivisions having a first average roughness and second subdivisions having a second average roughness, wherein the first average roughness is greater than the second average roughness.

Individual examples relate to a method for producing a semiconductor package, the method comprising providing a semiconductor chip, providing a metal sheet having a first sheet surface and an opposite second sheet surface, wherein the semiconductor chip is arranged at the second sheet surface, and encapsulating the semiconductor chip in an encapsulation body, wherein the first sheet surface is exposed at the encapsulation body, and wherein the first sheet surface has a pattern of first subdivisions having a first average roughness and second subdivisions having a second average roughness, wherein the first average roughness is greater than the second average roughness.

BRIEF DESCRIPTION OF THE DRAWINGS

The accompanying drawings illustrate examples and together with the description serve to elucidate the principles of the disclosure. The elements in the drawings are not necessarily true to scale with respect to one another. Identical reference signs may designate mutually corresponding, similar or identical parts.

DETAILED DESCRIPTION

Semiconductor packages containing one or more semiconductor chips are described below. The semiconductor chips can be of various types and be produced by various technologies. The semiconductor chips can be designed for example as power semiconductor chips such as, for instance power MOSFETs (metal oxide semiconductor field effect transistors), IGBTs (insulated gate bipolar transistors), JFETs (junction field effect transistors), power bipolar transistors or power diodes. In one embodiment, semiconductor chips having a vertical structure can occur, that is to say that the semiconductor chips can be produced such that electric currents can flow in a direction perpendicular to the main surfaces of the semiconductor chips. In one embodiment, a semiconductor chip having a vertical structure can have contact elements on its two main surfaces, that is to say on its top side and its underside. Furthermore, the semiconductor packages described below can comprise integrated circuits for controlling the integrated circuits of other semiconductor chips, such as, for example, the integrated circuits of power semiconductor chips. The semiconductor chips can be produced from specific semiconductor material, such as, for instance, Si, SiC, SiGe, GaAs, or GaN.

Metal sheets for use in a semiconductor package are described below. The metal sheets can consist of any suitable metal or of any suitable metal alloy. The metal sheets can comprise or consist of Al, Cu or Fe, for example. The metal sheets can be e.g. part of a leadframe. The metal sheets can be thin and have e.g. a thickness of not more than 0.5 mm, not more than 1.0 mm, not more than 2.0 mm, or not more than 5.0 mm.

Figure 1A:
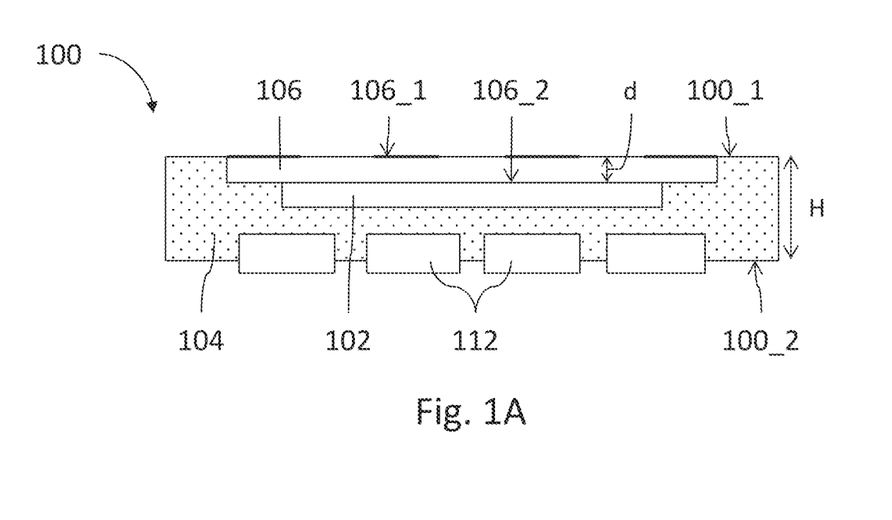
FIGS. 1A and 1B show a schematic illustration of a semiconductor package in a sectional view (FIG. 1A) and a plan view (FIG. 1B).

FIG. 1A shows one example of a semiconductor package 100 in a side view. The semiconductor package 100 comprises a semiconductor chip 102, an encapsulation body 104 and a metal sheet 106 having a first sheet surface 106_1 and an opposite second sheet surface 106_2. The first sheet surface 106_1 is exposed at the encapsulation body 104 and the semiconductor chip 102 is arranged at the second sheet surface 106_2 and is encapsulated by the encapsulation body 104.

Figure 1B:
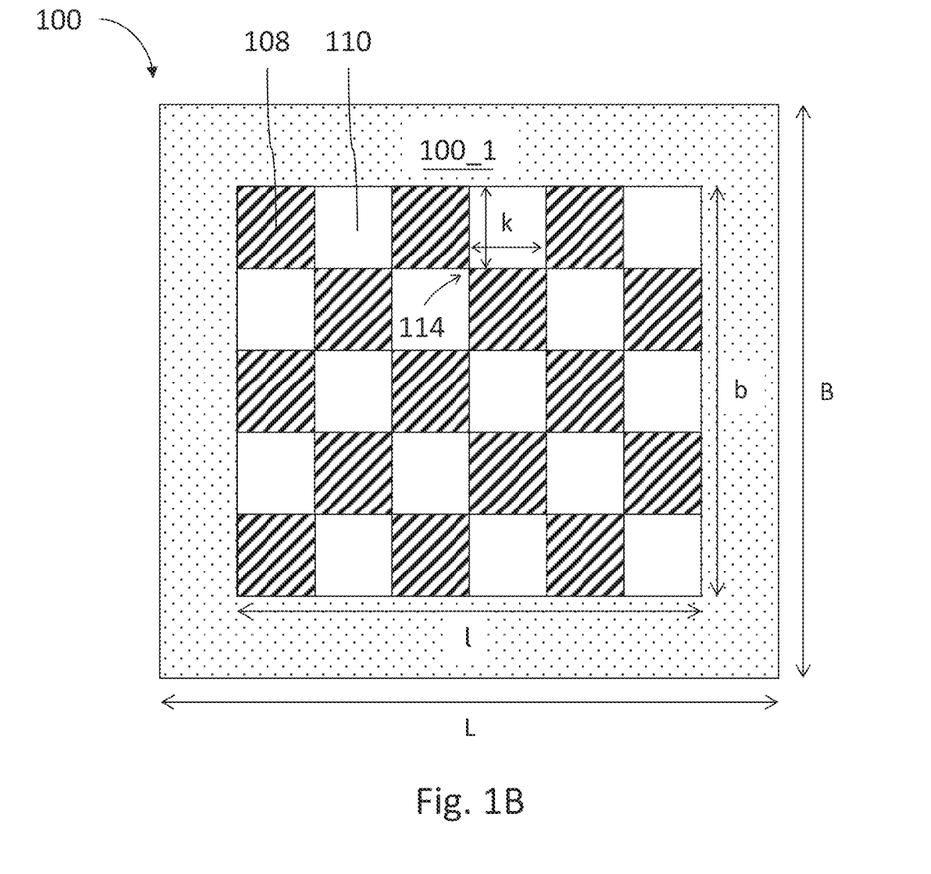

FIG. 1B shows a plan view of the semiconductor package 100, namely of that side of the encapsulation body 104 at which the first sheet surface 106_1 is exposed. The metal sheet 106_1 has, at the first sheet surface 106_1, a pattern having first subdivisions 108 having a first average roughness and second subdivisions 110 having a second average roughness, wherein the first average roughness is greater than the second average roughness. In other words, the first average roughness can be a relatively high average roughness and the second average roughness can be a relatively low average roughness (the average roughness indicates the average distance between a measurement point on the surface and the center line, wherein the center line intersects the actual profile within a reference path such that the sum of the profile deviations relative to the center line becomes minimal).

The semiconductor package 100 can be e.g. a power semiconductor package designed to process high currents, e.g. currents of approximately 100 A, 300 A, 500 A, 1 kA, 2 kA or more, and/or high voltages, e.g. voltages of approximately 20 V, 200 V, 500 V or 1000 V. The semiconductor package 100 can have substantially rectangular dimensions of a few millimeters to a few centimeters. A length L and a width B can be e.g. approximately 5 mm, 10 mm, 15 mm, 20 mm or 50 mm. A height H of the semiconductor package 100 can be e.g. approximately 0.5 mm, 2 mm, 10 mm, 15 mm or more.

The semiconductor chip 102 can be a power semiconductor chip configured to process high currents and/or high voltages. In accordance with one example, the semiconductor chip 102 is electrically insulated from the metal sheet 106. In accordance with another example, the semiconductor chip 102 is electrically connected to the metal sheet 106, e.g. via an electrode arranged on that surface of the semiconductor chip 102 which faces the second sheet surface 106_2. During operation, the semiconductor chip 102 generates heat, which must be dissipated from the semiconductor package 100, e.g. by way of a heat conducting path comprising the metal sheet 106.

The encapsulation body 104 can consist of a plastics material or comprise a plastics material and also filler particles. The encapsulation body 104 can be, in particular, a molded body that was produced in an injection mold. The metal sheet 106 can be exposed at the encapsulation body 104 at a first main side 100_1 of the semiconductor package 100.

The semiconductor package 100 can have external contacts 112 on a second main side 100_2 situated opposite the first main side 100_1. The external contacts 112 can be configured to enable an electrical contact with the semiconductor chip 102 and/or with further electronic elements of the semiconductor package 100. The external contacts 112 can be configured for the customer to secure the semiconductor package to a further electronic component, such as e.g. a circuit board, and to electrically connect it thereto. The external contacts 112 can be e.g. gull wing type contacts. The external contacts 112 can be part of a leadframe.

The metal sheet 106 can be a die pad configured to carry the semiconductor chip 102. In accordance with another example, it is possible for the metal sheet 106 to be a clip secured to the semiconductor chip 102, e.g. to the rear side of the chip. In this case, the semiconductor package 100 can comprise an additional die pad. The metal sheet 106 can be part of a leadframe. In accordance with one example, the metal sheet 106 and the external contacts 112 can be part of the same leadframe. The metal sheet 106 can make up a large part or even the majority of the first main side 100_1 of the semiconductor package 100, e.g. approximately 50%, 70%, 90% or even 100%. The metal sheet 106 can have any suitable contour, e.g. a substantially rectangular or square contour. The metal sheet 106 can have a length l and a width b of a few millimeters to a few centimeters, e.g. approximately 6 mm, 8 mm, 10 mm, 15 mm, 20 mm, 4 cm, 8 cm or more. The metal sheet 106 can have e.g. a thickness d of 0.3 mm, 0.5 mm, 0.7 mm, 1 mm, 1.5 mm, 2 mm, 4 mm or more.

The first sheet surface 106_1 can be wholly or partly covered by the pattern having the first subdivisions 108 and second subdivisions 110. In particular, the first sheet surface 106_1 can have an edge that is not covered by the pattern, as explained in even greater detail further below.

The first subdivisions 108 and the second subdivisions 110 can all have the same or different dimensions. By way of example, subdivisions along an edge of the pattern can have different dimensions in comparison with subdivisions in the inner area of the pattern. The example in FIG. 1B shows that the first subdivisions 108 and second subdivisions 110 are arranged in a checkered pattern. However, it is also possible for the first and second subdivisions 108, 110 to be arranged in some other pattern. Examples of suitable patterns are described in greater detail further below.

The first and second subdivisions 108, 110 can have e.g. an edge length k that is less than 2 mm, in particular less than 1.5 mm, and is e.g. approximately 1.0 mm or less or even only approximately 0.5 mm.

The first subdivisions 108 can have e.g. an average roughness of 10 μm or more, in particular an average roughness of 30 μm. A maximum height of the surface unevennesses in the first subdivisions 108 can be less than 50 μm, less than 40 μm, less than 30 μm, or less than 20 μm. The second subdivisions 110 can have e.g. an average roughness of 0.5 μm or less, in particular 0.2 μm or less. A maximum height of the surface unevennesses in the second subdivisions 110 can be less than 20 μm, less than 10 μm, less than 5 μm, or less than 2 μm.

The pattern of the first and second subdivisions 108, 110 can be configured such that two adjacent second subdivisions 110 directly adjoin one another maximally at one corner 114, but do not have a common edge section. The pattern can be configured such that it has no second subdivision 110 having an extent of more than 1.0 mm, more than 1.2 mm, more than 1.5 mm or more than 2 mm along any direction.

In accordance with another example, the pattern is configured such that at least one second subdivision 110 has along a first direction an extent that is more than 1 mm, more than 1.2 mm, more than 1.5 mm or more than 2 mm, but along a second direction, which is perpendicular to the first direction, has an extent that does not exceed 1 mm or 1.2 mm or 1.5 mm or 2 mm.

The semiconductor package 100 can be configured to the effect that the external contacts 112 are covered with an electrolytic layer such as e.g. a layer composed of Sn. This electrolytically applied layer can serve, e.g. to secure the semiconductor package 100 to a circuit board by way of the external contacts 112 (that is to say that the electrolytically applied layer can serve as a solder layer). Electrolytically depositing such a layer can comprise dipping the semiconductor package 100 in an electrolytic bath, e.g. a tin-plating bath.

Figure 2A:
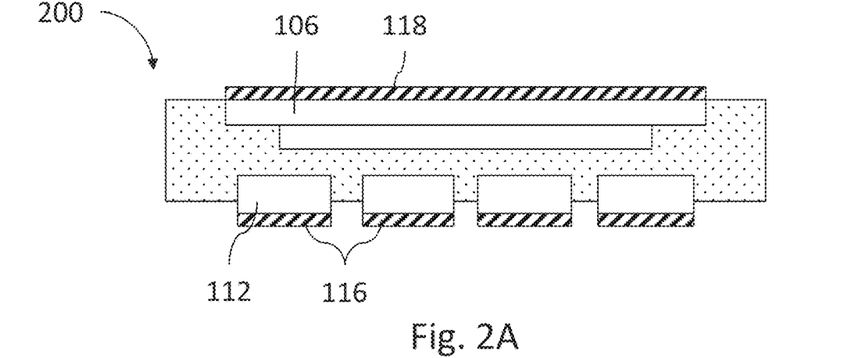
FIGS. 2A to 2C show schematic sectional views of a semiconductor package, which is connected to a circuit board and a heat sink, in various process steps.

FIG. 2A shows a semiconductor package 200 after the process of electrolytically depositing a first electrolytic layer 116 on the external contacts 112. The semiconductor package 200 differs from the semiconductor package 100 only in that it does not have the pattern having the first subdivisions 108 having the first average roughness and the second subdivisions 110 having the second average roughness.

As a result of dipping the semiconductor package 200 in an electrolytic bath, not only is the first electrolytic layer 116 produced on the external contacts 112, but also (in an undesired manner) a second electrolytic layer 118 is produced on the metal sheet 106 since the metal sheet 106, just like the external contacts 112, is exposed at the encapsulation body 104.

Figure 2B:
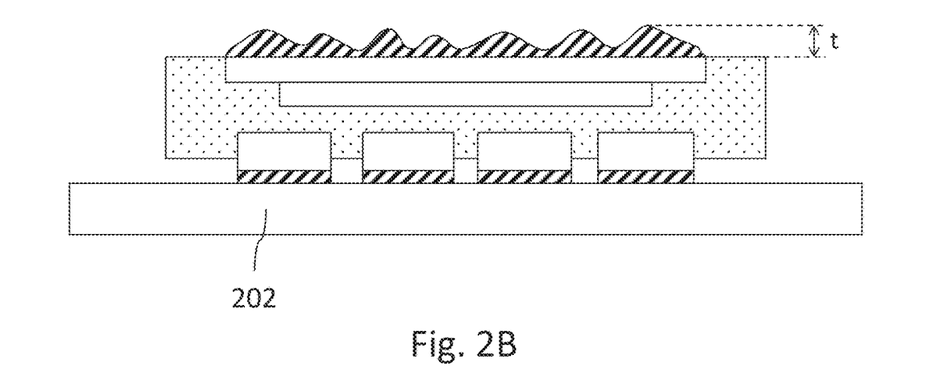

FIG. 2B shows the semiconductor package 200 after being fitted to a circuit board 202. Fitting the semiconductor package 200 to the circuit board 202 can comprise a reflow soldering process, which results in both the first electrolytic layer 116 and the second electrolytic layer 118 being liquefied. This can have the effect that the second electrolytic layer 118 forms unevennesses on account of its surface tension, for instance, as shown in FIG. 2B. These unevennesses have a specific depth t above the semiconductor package 200. The depth t can be e.g. approximately 40 μm or more.

Figure 2C:
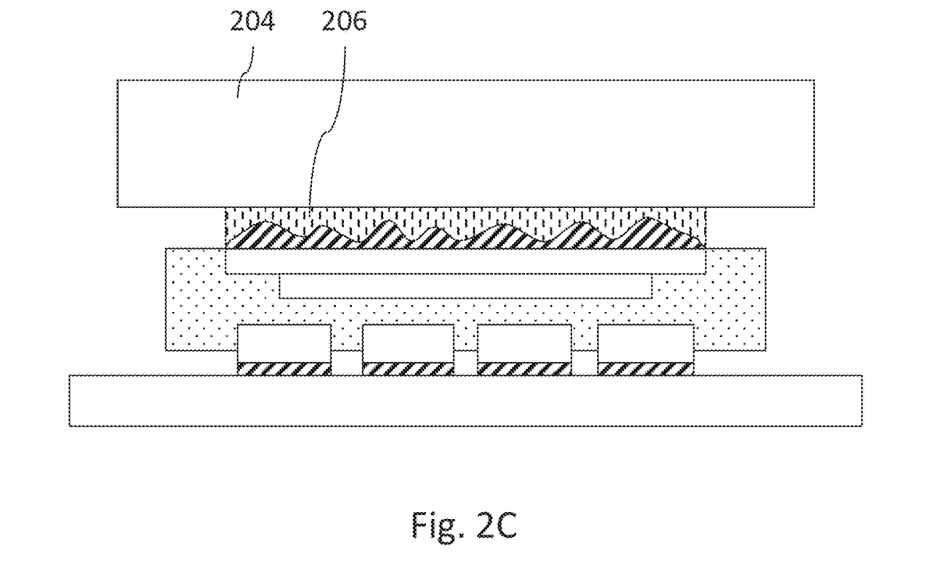

FIG. 2C shows the semiconductor package 200 after the fitting of a heat sink 204 above the metal sheet 106. A thermally conductive paste 206 is arranged between the heat sink 204 and the second electrolytic layer 118. The thermally conductive paste 206 allows heat transfer from the metal sheet 106 to the heat sink 204 and can simultaneously provide for electrical insulation of the metal sheet 106 from the heat sink 204.

On account of the unevennesses in the second electrolytic layer 118 described above, the thermally conductive paste 206 cannot be applied only with the minimum layer thickness required to ensure the electrical insulation between metal sheet 106 and heat sink 204. Instead, the thermally conductive paste 206 must be applied with a thickness such that a maximum depth t of the unevennesses in the second electrolytic layer is also overcome. The thermal resistance between the metal sheet 106 and the heat sink 204 is increased as a result.

This problem could be solved by the metal sheet 106 being provided with a covering during the process of dipping the semiconductor package 200 into the electrolytic bath. In this case, the second electrolytic layer 118 and thus also the unevennesses therein would not even be formed in the first place. However, this has the disadvantage that such a selective covering of the metal sheet 106 (and removal of the covering before the fitting of the heat sink 204) makes the production process of the semiconductor package 200 more expensive.

However, the maximum depth t of the unevennesses in the second electrolytic layer 118 can be reduced to an acceptable amount, or even almost eliminated, by means of the pattern described further above having the first subdivisions 108 having the first average roughness and the second subdivisions 110 having the second average roughness. This is because the pattern causes the second electrolytic layer 118 to accumulate, after liquefaction, primarily above the second subdivisions 110 having the relatively low average roughness and in the process to form unevennesses that are comparatively smaller than if the pattern were not present. The expression "average roughness" herein denotes the measure of the surface roughness of the first sheet surface 106_1, in particular the desirably smooth surface of the first subdivisions 108 and the desired unevennesses of the second subdivisions 110. The expression "depth", by contrast, denotes the height of the surface irregularities of the applied layer 118 after the reflow soldering process.

Figure 3A:
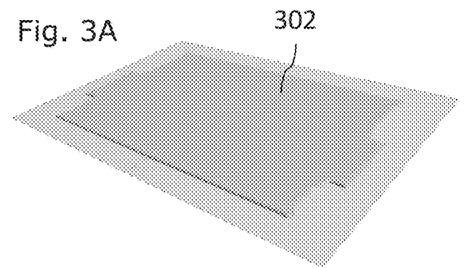
FIGS. 3A to 3I schematically show a perspective view of an electrolytically applied layer distributed over a pattern of first and second subdivisions having different average roughnesses relative to one another.
Figure 3B:
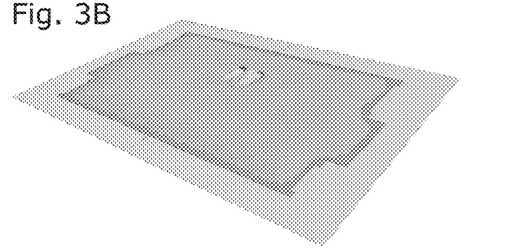
Figure 3C:
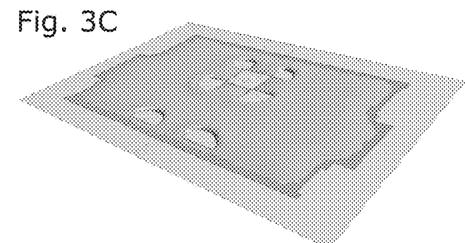
Figure 3D:
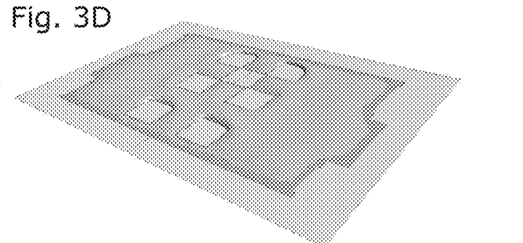
Figure 3E:
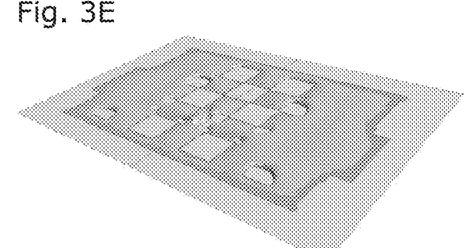
Figure 3F:
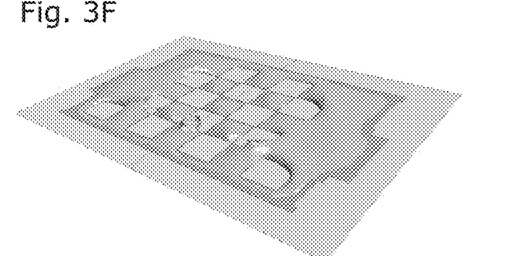
Figure 3G:
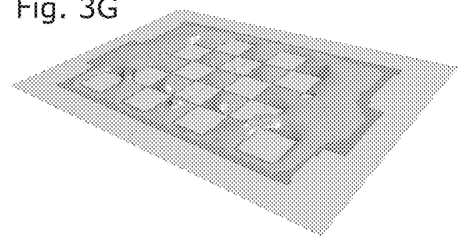
Figure 3H:
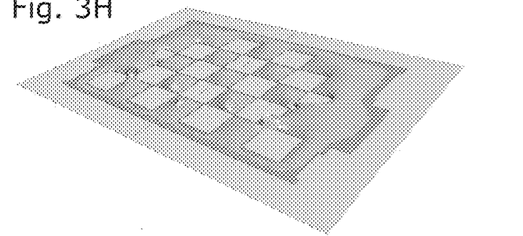

FIGS. 3A-3I show a tin layer 302, which was applied electrolytically with a thickness of 8 μm on a pattern of first subdivisions 108 and second subdivisions 110 (FIG. 3A). After the tin layer 302 was liquefied, e.g. in a reflow furnace, the tin layer begins to accumulate above second subdivisions 110 having the relatively low average roughness under the influence of cohesion forces (FIGS. 3B-3H). This accumulation of the tin layer 302 above the second subdivisions 110 can be caused by a minimization of the surface tension of the tin layer 302, the tin layer 302 accumulating on such parts of the surface which have a lower average roughness than other parts of the surface. In other words, the tin layer 302 is displaced above the first subdivisions 108 having the relatively high average roughness. Subfigure 3I shows the result of this process; the tin layer 302 is (almost) exclusively arranged above the second subdivisions 110.

Figure 3I:
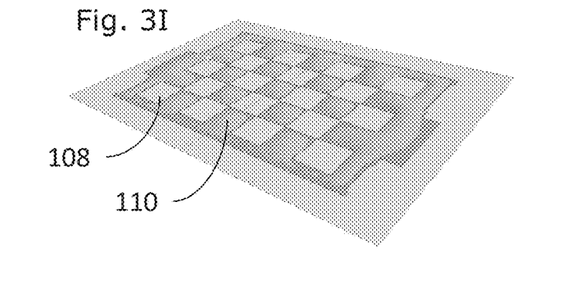

The division of the formerly continuous tin layer 302 into individual, almost unconnected tin patches, as illustrated in FIG. 3I, has the effect that unevennesses in the tin such as are illustrated in FIGS. 2B and 2C have a smaller maximum depth t than in the case of a continuous tin layer. To put it another way, the tin patches above the pattern of first and second subdivisions 108, 110 as in FIG. 3I have a smaller average depth t than the randomly continuous tin layer as in FIG. 2B. The depth t in the randomly continuous tin layer can arise because the tin layer without a surface topography (a pattern) of the underlying sheet surface, during the reflow soldering process, can form random unevennesses having a relatively large depth t. As a result of the topography of the sheet surface (i.e. as a result of the pattern), by contrast, the depth t of the unevennesses that form can be effectively limited. As a result of the pattern, the maximum depth t can be reduced from e.g. approximately 32 μm to approximately 18 μm, i.e. by approximately 44%. To put it another way, the average depth t of the layer 118 applied electrolytically on the metal sheet 106 can be reduced e.g. from approximately 40 μm without the pattern to e.g. 20 μm or 18 μm or less with the pattern.

Compared with the abovementioned covering of the metal sheet 106 in the electrolytic bath, the pattern having the first and second subdivisions 108, 110 can have the advantage that it is easier to produce and thus makes the production process of the semiconductor package 100 more favorable.

The first subdivisions 108 can have any desired surface structure having the comparatively high average roughness, e.g. a symmetrical structuring or else an asymmetrical structuring. The surface structure can have depressions and/or elevations. The surface structure can have projections, grooves, craters, bulges, etc.

In accordance with one example, the pattern having the first and second subdivisions 108, 110 can be produced by the metal sheet 106 being subjected to a rolling process and/or a stamping process, wherein the negative of the pattern is transferred from the rolling tool and/or stamping tool to the metal sheet 106.

Figure 4:
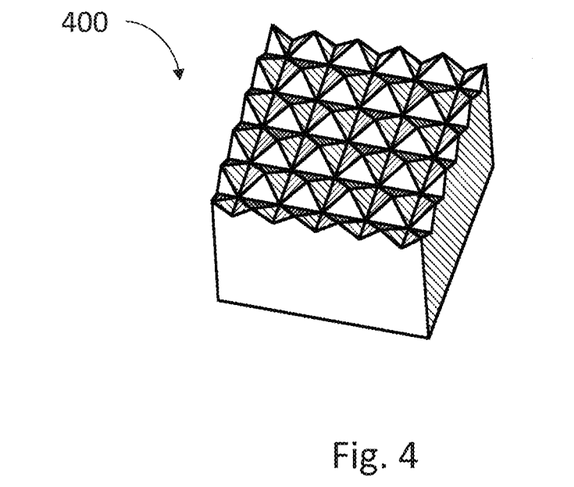
FIG. 4 schematically shows a perspective view of an excerpt from a first subdivision having relatively high average roughness.

FIG. 4 shows a perspective view of an excerpt 400 from a first subdivision 108 having the relatively high average roughness. The example in FIG. 4 shows one possible surface structure which the first subdivisions 108 can have and which has the desired average roughness.

In the example in FIG. 4, the surface of the first subdivisions 108 has a multiplicity of pyramidal vertices 402 arranged in a matrix. The pyramidal vertices 402 can have e.g. a height of 10 μm, 20 μm, 30 μm, 40 μm or more. The pyramidal vertices 402 can have e.g. a base length of 10 μm, 20 μm, 30 μm, 40 μm or more. It is also conceivable for the first subdivisions 108 to have e.g. conical vertices or vertices which are not oriented in a matrix, but rather in some other arrangement.

Figure 5:
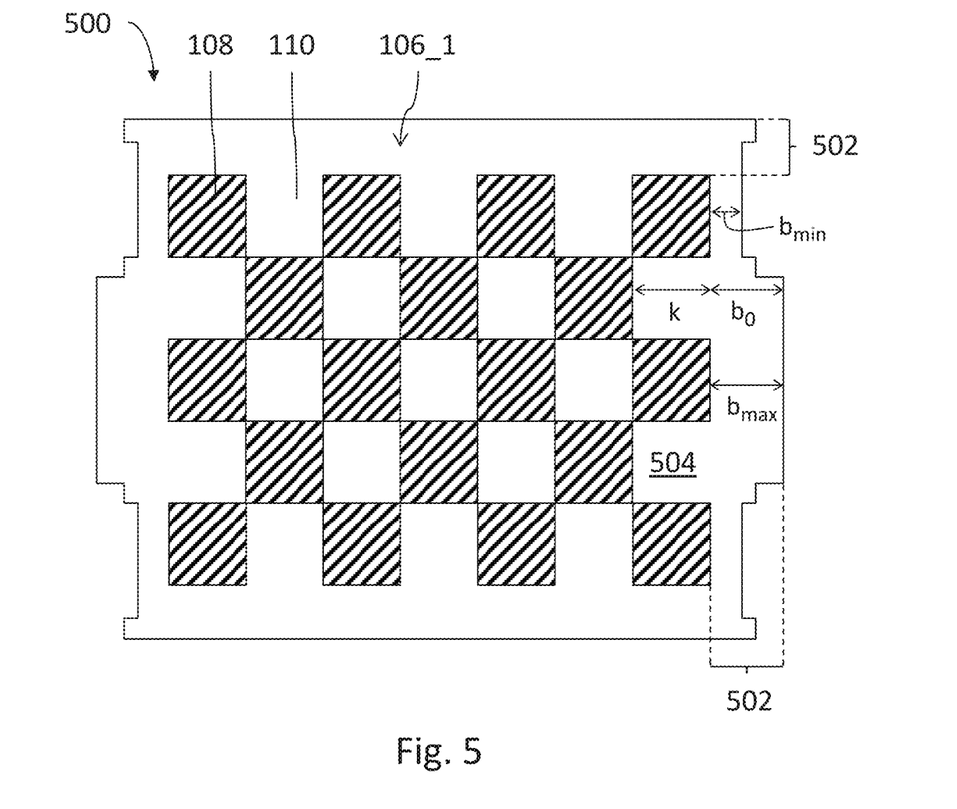
FIG. 5 shows a metal sheet for use in a semiconductor package.

FIG. 5 shows one example of a metal sheet 500. The metal sheet 500 can be identical to the metal sheet 106 and it can be used instead of the metal sheet 106 in the semiconductor package 100.

The metal sheet 500 can have the same pattern of first and second subdivisions 108, 110 that has already been described with regard to the metal sheet 106. In accordance with one example, the pattern can cover the entire upper surface of the metal sheet 500. In accordance with another example, the pattern can cover only a part of the upper surface of the metal sheet 500. In particular, the metal sheet 500 can have an edge 502 that is arranged around the pattern of the first and second subdivisions 108, 110. The edge 502 can completely enclose the pattern.

The entire edge 502 can have the relatively low average roughness (i.e. the same average roughness as the second subdivisions 110). The edge 502 can have a minimum width burin of at least 0.2 mm, in particular at least 0.4 mm or at least 0.6 mm. The edge 502 can have a maximum width borax of 1.5 mm or less, in particular 1.0 mm or less.

The edge 502 can have a local width $b_0$ at a point at which the outer subdivision 504 of the pattern of first and second subdivisions 108, 110 is a second subdivision 110. The edge 502 can be configured such that the sum of local width $b_0$ and edge length k of the outer subdivision 104 is not more than 1.5 mm or more than 1.2 mm or more than 1.0 mm for any outer subdivision 504.

The edge 502 having the relative low average roughness can have the purpose of improving the production of the encapsulation body 104. The encapsulation body can be produced by means of an injection-molding method, for example. In this case, a metal sheet 106 or 500 is positioned in an injection-molding tool such that the second sheet surface 106_2 faces into the cavity of the injection-molding tool. By virtue of the fact that the edge 502 has the relatively low average roughness, it can bear tightly against the injection-molding tool. This prevents injection-molding compound from being able to reach the first sheet surface 106_1. This would increase e.g. the thermal resistance between the metal sheet 106 or 500 and the heat sink 204.

The minimum width brain of the edge 502 can be chosen such that the edge 502 in the injection-molding tool can completely seal the first sheet surface 106_1. The maximum width borax of the edge 502 can be chosen such that unevennesses of the first electrolytic layer 116 (cf. further above) above the edge are not larger than the unevennesses above the pattern of first and second subdivisions 108, 110.

Figure 6:
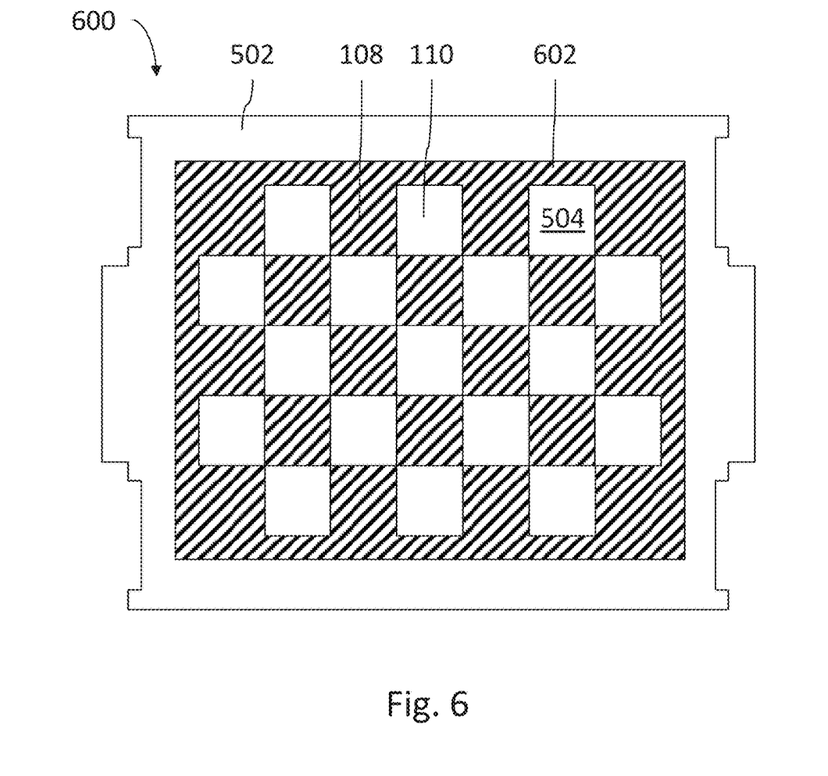
FIG. 6 shows an alternative example of a metal sheet for use in a semiconductor package, wherein the pattern of first and second subdivisions has an additional frame.

FIG. 6 shows a further example of a metal sheet 600, which can be identical to the metal sheets 106 and 500, apart from the differences mentioned below.

The metal sheet 600 likewise has the pattern of first and second subdivisions 108, 110 and the edge 502. In addition, the metal sheet 600 also has a frame 602, which has the relatively high average roughness. The frame 602 can completely or at least partly surround the pattern of first and second subdivisions 108, 110. The frame 602 can have the purpose of preventing an outer subdivision 504 which is a second subdivision 110 from directly adjoining the edge 502 having the relatively low average roughness. It is thus possible, in the metal sheet 600, to prevent the case where the edge length k of an outer subdivision 504 is added to the local edge width $b_0$ (cf. FIG. 5).

The size of a patch of surface having the relatively low average roughness can thus be limited to a greater extent on the metal sheet 600 than on the metal sheet 500. This can contribute to more targeted limitation of the maximum depth t of the unevennesses in the first electrolytic layer 116 above the metal sheet 600.

FIGS. 7A-7F show examples of possible patterns of first and second subdivisions 108, 110 which the metal sheets 106, 500 and 600 can have instead of a checkered pattern.

Figure 7A:
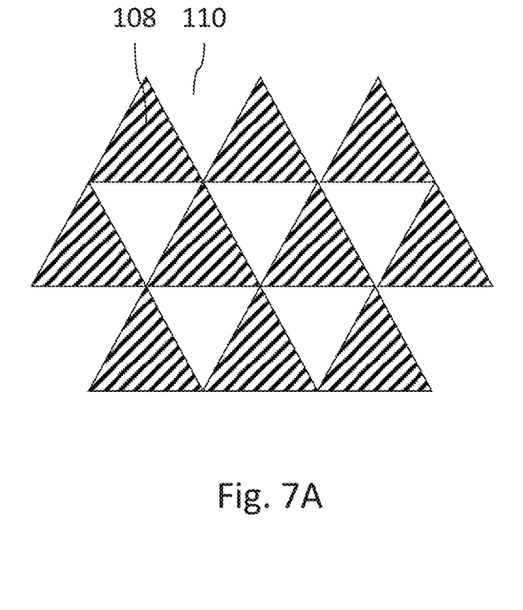
FIGS. 7A to 7F show various examples of patterns of first and second subdivisions.

In accordance with the example in FIG. 7A, the first and second subdivisions 108, 110 can have the shape of triangles, e.g. equilateral triangles. The triangles can be arranged in a matrix.

Figure 7B:
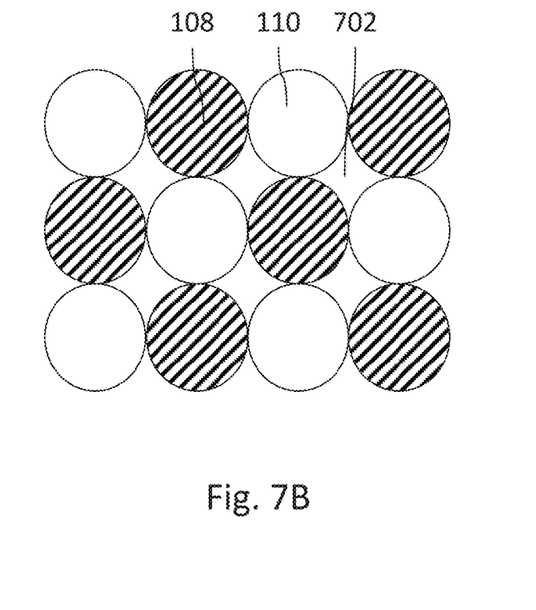

In accordance with the example in FIG. 7B, the first and second subdivisions 108, 110 can have the shape of circles. The circles can be arranged in a matrix. Adjacent circles can respectively touch one another. Interspaces 702 between adjacent circles can have the relatively lower average roughness.

Figure 7C:
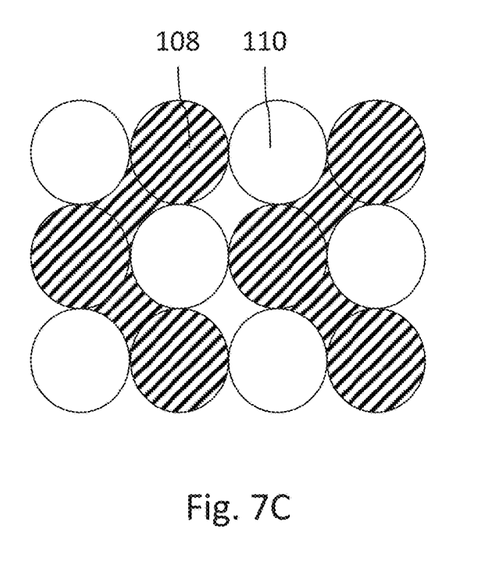

In accordance with the example in FIG. 7C, successive interspaces 702 can respectively have the relatively lower average roughness and the relatively higher average roughness.

Figure 7D:
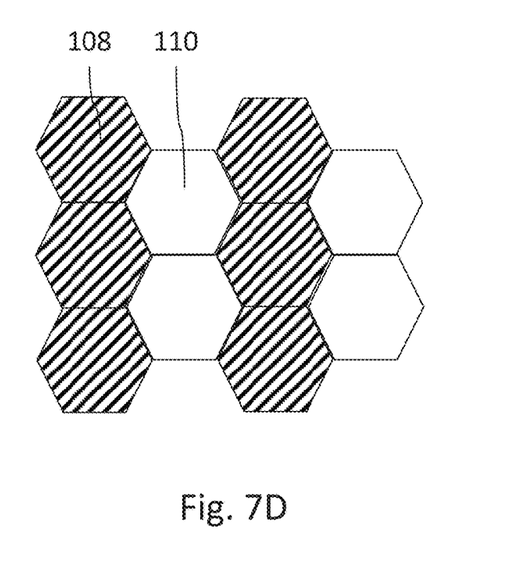

In accordance with the example in FIG. 7D, the first and second subdivisions 108, 110 can be regular hexagons. The first subdivisions 108 and respectively the second subdivisions 110 can be arranged in successive rows or columns.

Figure 7E:
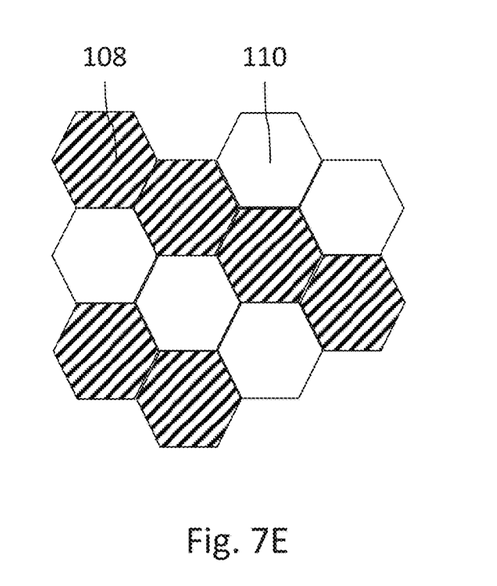

In accordance with the example in FIG. 7E, the first subdivisions 108 and respectively the second subdivisions 110 can also be arranged in successive diagonals.

Figure 7F:
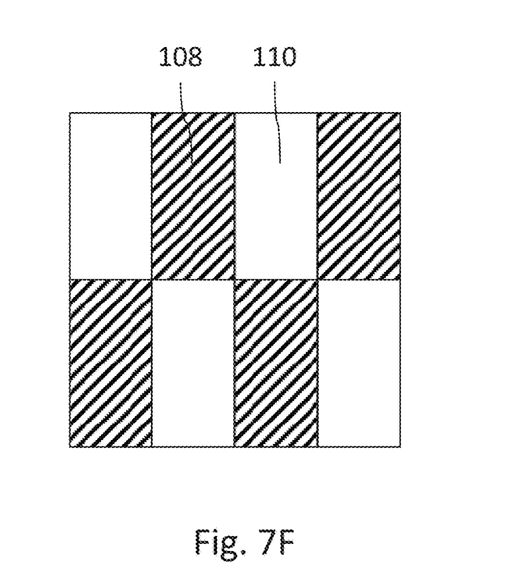

In accordance with the example in FIG. 7F, the first and second subdivisions 108, 110 can in each case have a rectangular shape and be arranged alternately successively.

Figure 8:
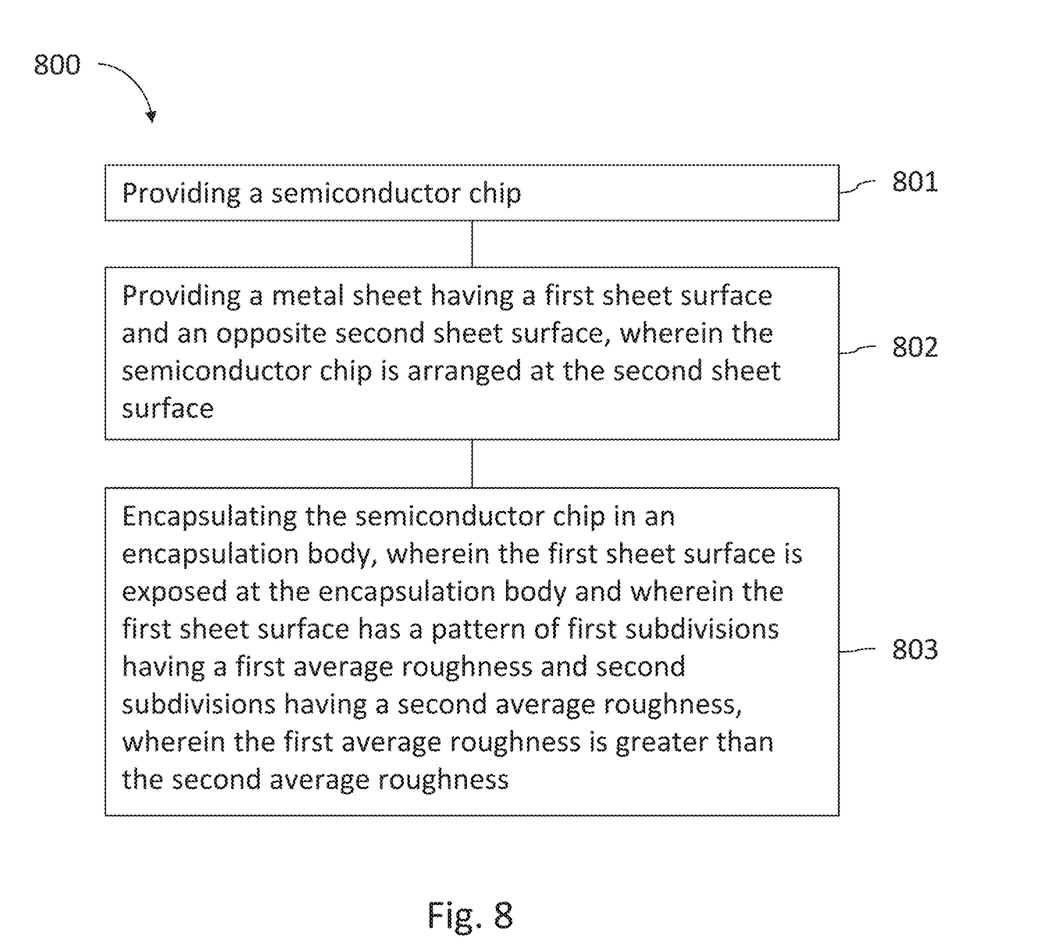
FIG. 8 shows a flow diagram of a method for producing a semiconductor package.

FIG. 8 shows a flow diagram of a method 800 for producing a semiconductor package. The method 800 can be used e.g. to produce the semiconductor package 100.

The method 800 comprises, at 801, providing a semiconductor chip, at 802, providing a metal sheet having a first sheet surface and an opposite second sheet surface, wherein the semiconductor chip is arranged at the second sheet surface, and, at 803, encapsulating the semiconductor chip in an encapsulation body, wherein the first sheet surface is exposed at the encapsulation body, and wherein the first sheet surface has a pattern of first subdivisions having a first average roughness and second subdivisions having a second average roughness, wherein the first average roughness is greater than the second average roughness.

In accordance with one example, the method 800 can furthermore comprise the metal sheet being stamped in order to produce the pattern. In accordance with a further example, the method 800 can comprise the metal sheet being rolled in order to produce the pattern. This stamping or rolling can be e.g. part of a singulation process by which the metal sheet is singulated from a leadframe. In accordance with one example, the method 800 can furthermore comprise electrolytically depositing a metal layer on the first sheet surface. The electrolytic deposition can be carried out e.g. by the semiconductor package being dipped into an electrolytic bath, e.g. into a tin-plating bath. The method 800 can furthermore comprise a thermally conductive paste being applied on the metal layer and a heat sink being arranged on the thermally conductive paste.

The semiconductor package, the metal sheet for use in a semiconductor package, and the method for producing a semiconductor package are explained in greater detail below on the basis of examples.

Example 1 is a semiconductor package, comprising: a semiconductor chip, an encapsulation body, which encapsulates the semiconductor chip, and a metal sheet having a first sheet surface and an opposite second sheet surface, wherein the first sheet surface is exposed at the encapsulation body and wherein the semiconductor chip is arranged at the second sheet surface, and wherein the first sheet surface has a pattern having first subdivisions having a first average roughness and second subdivisions having a second average roughness, wherein the first average roughness is greater than the second average roughness.

Example 2 is a semiconductor package according to example 1, wherein the pattern comprises a checkered pattern, or a pattern of triangles, circles, hexagons or rectangles arranged in a matrix.

Example 3 is a semiconductor package according to example 1 or 2, wherein the first subdivisions have an average roughness of 10 µm or more, in particular an average roughness of 30 µm.

Example 4 is a semiconductor package according to example 3, wherein the second subdivisions have an average roughness of 0.5 µm or less, in particular 0.2 µm or less.

Example 5 is a semiconductor package according to any of the preceding examples, wherein the first subdivisions have an edge length of 1.5 mm or less, in particular 1.0 mm or less.

Example 6 is a semiconductor package according to any of the preceding examples, wherein the pattern is completely surrounded by an edge of the first sheet surface, wherein the edge has a width of at least 0.2 mm, in particular at least 0.4 mm, and wherein the edge has the second average roughness.

Example 7 is a semiconductor package according to example 6, wherein the width of the edge is 1.5 mm or less, in particular 1.0 mm or less.

Example 8 is a semiconductor package according to any of the preceding examples, furthermore comprising: an electrolytic layer applied on the pattern, wherein the electrolytic layer is arranged primarily above the second subdivisions.

Example 9 is a semiconductor package according to example 8, furthermore comprising: a heat sink arranged above the first sheet surface, wherein a thermally conductive paste is arranged between the heat sink and the electrolytic layer.

Example 10 is a semiconductor package according to example 8 or 9, wherein the electrolytic layer has an average roughness of 10 µm or less, in particular 9 µm or less.

Example 11 is a semiconductor package according to any of the preceding examples, wherein the first sheet surface is exposed at a first surface of the encapsulation body, the semiconductor package furthermore comprising: external contacts arranged at a second surface of the encapsulation body, said second surface being situated opposite the first surface.

Example 12 is a metal sheet for use in a semiconductor package, the metal sheet comprising: a first sheet surface and an opposite second sheet surface, wherein the second sheet surface is configured for application to a semiconductor chip, and wherein the first sheet surface has a pattern of first subdivisions having a first average roughness and second subdivisions having a second average roughness, wherein the first average roughness is greater than the second average roughness.

Example 13 is a metal sheet according to example 12, wherein the pattern comprises a checkered pattern.

Example 14 is a method for producing a semiconductor package, the method comprising: providing a semiconductor chip, providing a metal sheet having a first sheet surface and an opposite second sheet surface, wherein the semiconductor chip is arranged at the second sheet surface, and encapsulating the semiconductor chip in an encapsulation body, wherein the first sheet surface is exposed at the encapsulation body, and wherein the first sheet surface has a pattern of first subdivisions having a first average roughness and second subdivisions having a second average roughness, wherein the first average roughness is greater than the second average roughness.

Example 15 is a method according to example 14, furthermore comprising: stamping the metal sheet in order to produce the pattern.

Example 16 is a method according to example 14, furthermore comprising: rolling the metal sheet in order to produce the pattern.

Example 17 is a method according to any of examples 14 to 16, furthermore comprising: electrolytically depositing a metal layer on the first sheet surface.

Example 18 is a method according to example 17, furthermore comprising: applying a thermally conductive paste on the metal layer and arranging a heat sink on the thermally conductive paste.

Example 19 is a device for producing a semiconductor package, wherein the device comprises means for carrying out a method according to any of examples 14 to 18.

Although specific embodiments have been illustrated and described herein, it is obvious to the person of average skill in the art that a multiplicity of alternative and/or equivalent implementations can replace the specific embodiments shown and described, without departing from the scope of the present disclosure. This application is intended to cover all adaptations or variations of the specific embodiments discussed herein. Therefore, the intention is for this disclosure to be restricted only by the claims and the equivalents thereof.

What is claimed is:

1. A semiconductor package, comprising:
   a semiconductor chip;
   an encapsulation body encapsulating the semiconductor chip;
   a metal sheet having a first sheet surface and an opposite second sheet surface, the first sheet surface has a pattern having first subdivisions having a first average roughness and second subdivisions having a second average roughness; and
   an electrolytic layer applied on the pattern,
   wherein the first sheet surface is exposed at the encapsulation body,
   wherein the semiconductor chip is arranged at the second sheet surface,
   wherein the first average roughness is greater than the second average roughness,
   wherein the maximum depth of the electrolytic layer is 18 µm or less.

2. The semiconductor package of claim 1, wherein the pattern comprises a checkered pattern, or a pattern of triangles, circles, hexagons or rectangles arranged in a matrix.

3. The semiconductor package of claim 1, wherein the first subdivisions have an average roughness of 10 μm or more.

4. The semiconductor package of claim 3, wherein the second subdivisions have an average roughness of 0.5 μm or less.

5. The semiconductor package of claim 1, further comprising:
a heat sink arranged above the first sheet surface; and
a thermally conductive paste arranged between the heat sink and the electrolytic layer.

6. The semiconductor package of claim 1, wherein the first sheet surface is exposed at a first surface of the encapsulation body, the semiconductor package further comprising:
external contacts arranged at a second surface of the encapsulation body, the second surface being situated opposite the first surface.

7. The semiconductor package of claim 1, wherein the pattern is completely surrounded by an edge of the first sheet surface, wherein the edge has a minimum width of at least 0.2 mm, and wherein the edge has the second average roughness.

8. A semiconductor package, comprising:
a semiconductor chip;
an encapsulation body encapsulating the semiconductor chip; and
a metal sheet having a first sheet surface and an opposite second sheet surface,
wherein the first sheet surface is exposed at the encapsulation body,
wherein the semiconductor chip is arranged at the second sheet surface,
wherein the first sheet surface has a pattern having first subdivisions having a first average roughness and second subdivisions having a second average roughness,
wherein the first average roughness is greater than the second average roughness,
wherein the first subdivisions have an edge length of 1.5 mm or less.

9. A semiconductor package, comprising:
a semiconductor chip;
an encapsulation body encapsulating the semiconductor chip; and
a metal sheet having a first sheet surface and an opposite second sheet surface,
wherein the first sheet surface is exposed at the encapsulation body,
wherein the semiconductor chip is arranged at the second sheet surface,
wherein the first sheet surface has a pattern having first subdivisions having a first average roughness and second subdivisions having a second average roughness,
wherein the first average roughness is greater than the second average roughness,
wherein the first sheet surface is exposed at a first surface of the encapsulation body, the semiconductor package further comprising:
external contacts arranged at a second surface of the encapsulation body, the second surface being situated opposite the first surface.

10. The semiconductor package of claim 9, wherein the first subdivisions have an average roughness of 10 μm or more.

11. The semiconductor package of claim 10, wherein the second subdivisions have an average roughness of 0.5 μm or less.

12. The semiconductor package of claim 9, wherein the first subdivisions have an edge length of 1.5 mm or less.

13. The semiconductor package of claim 9, wherein the pattern is completely surrounded by an edge of the first sheet surface, wherein the edge has a minimum width of at least 0.2 mm, and wherein the edge has the second average roughness.

14. The semiconductor package of claim 13, wherein the maximum width of the edge is 1.5 mm or less.

15. The semiconductor package of claim 9, further comprising:
an electrolytic layer applied on the pattern,
wherein the electrolytic layer is arranged primarily above the second subdivisions.

16. The semiconductor package of claim 15, further comprising:
a heat sink arranged above the first sheet surface; and
a thermally conductive paste arranged between the heat sink and the electrolytic layer.

17. The semiconductor package of claim 15, wherein the electrolytic layer has an average roughness of 10 μm or less.

18. The semiconductor package of claim 8, wherein the first sheet surface is exposed at a first surface of the encapsulation body, the semiconductor package further comprising:
external contacts arranged at a second surface of the encapsulation body, the second surface being situated opposite the first surface.

19. The semiconductor package of claim 15, further comprising:
a circuit board soldered to the second sheet surface,
wherein the electrolytic layer is tin.

20. The semiconductor package of claim 16, wherein the average depth of the electrolytic layer is less than 20 μm.

21. A semiconductor package, comprising:
a semiconductor chip;
an encapsulation body encapsulating the semiconductor chip; and
a metal sheet having a first sheet surface and an opposite second sheet surface,
wherein the first sheet surface is exposed at the encapsulation body,
wherein the semiconductor chip is arranged at the second sheet surface,
wherein the first sheet surface has a pattern having first subdivisions having a first average roughness and second subdivisions having a second average roughness,
wherein the first average roughness is greater than the second average roughness,
wherein the pattern is completely surrounded by an edge of the first sheet surface,
wherein the edge has a minimum width of at least 0.2 mm,
wherein the edge has the second average roughness.

22. A semiconductor package, comprising:
a semiconductor chip;
an encapsulation body encapsulating the semiconductor chip; and
a metal sheet having a first sheet surface and an opposite second sheet surface,
wherein the first sheet surface is exposed at the encapsulation body,
wherein the semiconductor chip is arranged at the second sheet surface,
wherein the first sheet surface has a pattern having first subdivisions having a first average roughness and second subdivisions having a second average roughness, wherein the first average roughness is greater than the second average roughness, wherein the pattern is completely surrounded by an edge of the first sheet surface, wherein the edge has a minimum width of at least 0.2 mm, wherein the edge has the second average roughness, wherein the maximum width of the edge is 1.5 mm or less.

23. The semiconductor package of claim 9, wherein the pattern comprises a checkered pattern, or a pattern of triangles, circles, hexagons or rectangles arranged in a matrix.

* * * * *